(12) United States Patent
Lin

(10) Patent No.: US 7,834,394 B2
(45) Date of Patent: Nov. 16, 2010

(54) SEMICONDUCTOR STRUCTURE AND METHOD OF FABRICATING THE SAME

(75) Inventor: Hung-Sung Lin, Miaoli County (TW)

(73) Assignee: United Microelectronics Corp., Science-Based Industrial Park, Hsinchu (TW)

( * ) Notice: Subject to any disclaimer, the term of this patent is extended or adjusted under 35 U.S.C. 154(b) by 74 days.

(21) Appl. No.: 12/325,869

(22) Filed: Dec. 1, 2008

(65) Prior Publication Data
US 2010/0133594 A1    Jun. 3, 2010

(51) Int. Cl.
*H01L 29/66* (2006.01)

(52) U.S. Cl. ............... 257/330; 257/48; 257/E27.091; 257/E21.521; 257/E29.321; 257/E21.428; 438/18; 438/270

(58) Field of Classification Search ......... 257/330–332, 257/E27.091, E29.2, 48, E29.321, E21.428; 438/270, 11, 14, 18, FOR. 142, FOR. 180
See application file for complete search history.

(56) References Cited

U.S. PATENT DOCUMENTS 5,122,846 A * 6/1992 Haken .......................... 257/66
6,465,842 B2 * 10/2002 Nishinohara ................ 257/330
7,148,527 B2 * 12/2006 Kim et al. .................... 257/288
2009/0020754 A1 * 1/2009 Suryagandh et al. .......... 257/48

OTHER PUBLICATIONS

Authored by Rasras, et al., article titled "Substrate Hole Current Origin after Oxide Breakdown", adopted from IEEE 2000, paged 537-540.
Authored by Kaczer, et al., article titled "Potential Vulnerability of Dynamic CMOS Logic to Soft Gate Oxide Breakdown", adopted from IEEE, vol. 24, No. 12, Dec. 2003, paged 742-744.
Authored by Kaczer, et al., article titled "Understanding nMOSFET characteristics after soft breakdown and their dependence on the breakdown location", adopted from ESSDERC 2002, paged 139-142.

* cited by examiner

*Primary Examiner*—Matthew S Smith
*Assistant Examiner*—Quovaunda Jefferson
(74) *Attorney, Agent, or Firm*—Winston Hsu; Scott Margo; Min-Lee Teng

(57) ABSTRACT

A semiconductor structure including a substrate, a gate dielectric layer, a gate, a source region and a drain region is provided. The gate dielectric layer is disposed on the substrate. At least one recess is disposed in the substrate. The gate is disposed on the gate dielectric layer and in the recess. The source and drain regions are respectively disposed in the substrate beside the gate.

17 Claims, 6 Drawing Sheets

SEMICONDUCTOR STRUCTURE AND METHOD OF FABRICATING THE SAME

BACKGROUND OF THE INVENTION

1. Field of Invention

The present invention relates to an integrated circuit and a method of fabricating the same, and more generally to a semiconductor structure and a method of fabricating the same.

2. Description of Related Art

As the level of integration of a semiconductor device is getting higher, the dimension of the same is getting smaller. Therefore, the dimension of each component such as a current divider of the semiconductor device has to be reduced correspondingly.

A conventional current divider achieves the purpose of diving current by using a polysilicon layer and a metal layer formed in a snake shape. However, the polysilicn layer and the metal layer occupy a considerable large area, so that the dimension of the semiconductor device cannot be reduced. Further, the process for forming the current divider cannot be integrated with the current processes quite often, so that the process complexity is increased and the fabrication cost is higher.

Accordingly, how to design a current divider which occupies a small area and is compatible with the current processes has become one of the main topics in the industry.

SUMMARY OF THE INVENTION

The present invention provides a semiconductor structure serving as a current divider, which occupies a small area and is easy to integrate with the current processes.

The present invention further provides a method of fabricating a semiconductor structure. The formed semiconductor structure with low cost and high reliability not only serves as a small-dimension current divider, but also serves as a one time programming MOS structure.

The present invention provides a semiconductor structure including a substrate, a gate dielectric layer, a gate, a source region and a drain region. The gate dielectric layer is disposed on the substrate. At least one recess is disposed in the substrate. The gate is disposed on the gate dielectric layer and in the recess. The source and drain regions are respectively disposed in the substrate beside the gate.

According to an embodiment of the present invention, under an operation condition, an inversion layer or an accumulation layer is formed between the gate dielectric layer and the substrate, so that a gate current is divided into a source current flowing toward the source region and a drain current flowing toward the drain region along the inversion layer or the accumulation layer.

According to an embodiment of the present invention, when the shortest distance between the at least one recess and the source region is L1 and the shortest distance between the at least one recess and the drain region is L2, the source current is proportional to L2/(L1+L2) and the drain current is proportional L1/(L1+L2).

According to an embodiment of the present invention, the semiconductor structure further includes a dielectric layer disposed on a surface of the recess.

According to an embodiment of the present invention, a dielectric layer is not disposed on a surface of the recess.

According to an embodiment of the present invention, the semiconductor structure further includes a well disposed in the substrate.

According to an embodiment of the present invention, the substrate includes silicon, for example.

According to an embodiment of the present invention, the gate dielectric layer includes silicon oxide, for example.

According to an embodiment of the present invention, the gate includes polysilicon, polycide, silicide or metal, for example.

The present invention further provides a method of fabricating a semiconductor structure. First, a gate dielectric layer is formed on the substrate. Thereafter, at least one recess is formed in the substrate. Afterwards, a gate is formed on the gate dielectric layer and in the recess. A source region and a drain region are then formed in the substrate beside the gate.

According to an embodiment of the present invention, under an operation condition, an inversion layer or an accumulation layer is formed between the gate dielectric layer and the substrate, so that a gate current is divided into a source current flowing toward the source region and a drain current flowing toward the drain region along the inversion layer or the accumulation layer.

According to an embodiment of the present invention, when the shortest distance between the at least one recess and the source region is L1 and the shortest distance between the at least one recess and the drain region is L2, the source current is proportional to L2/(L1+L2) and the drain current is proportional L1/(L1+L2).

According to an embodiment of the present invention, the step of forming the gate dielectric layer is before the step of forming the at least one recess.

According to an embodiment of the present invention, the step of forming the gate dielectric layer is after the step of forming the at least one recess.

According to an embodiment of the present invention, the step of forming the gate dielectric layer includes performing an oxidation process or a CVD process, for example.

According to an embodiment of the present invention, the step of forming the at least one recess includes performing an etching process, for example.

According to an embodiment of the present invention, the substrate includes silicon, for example.

According to an embodiment of the present invention, the gate dielectric layer includes silicon oxide, for example.

According to an embodiment of the present invention, the gate includes polysilicon, polycide, silicide or metal, for example.

In summary, in the present invention, the semiconductor structure in which at least one recess is disposed in the substrate and a dielectric layer is not disposed on the surface of the recess can serve as a current divider, and the purpose of diving the gate current into a source current and a drain current is achieved. The semiconductor structure serving as a current divider occupies a small area and is easy to integrate with the current processes, so that the process complexity is reduced and the fabrication cost is lower.

Further, in the present invention, the semiconductor structure in which at least one recess is disposed in the substrate and a dielectric layer is disposed on the surface of the recess can serve as a one time programming MOS structure for repairing codes of the device. The one time programming MOS structure of the present invention does not have unpredictable burned points, so that the reliability thereof is greatly enhanced.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
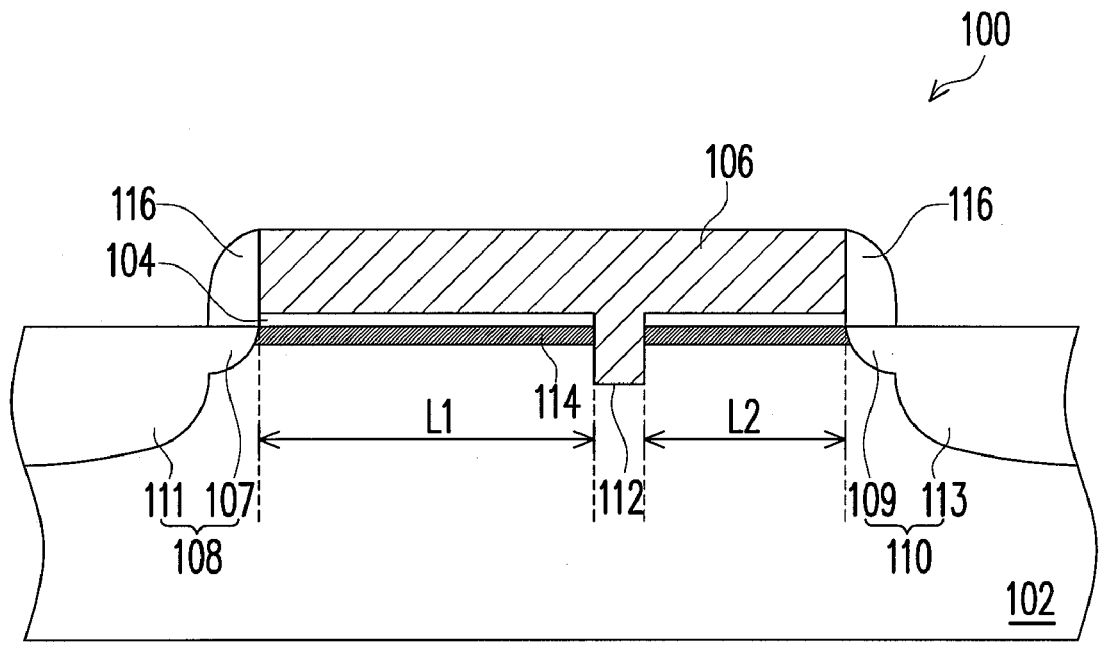
FIG. 1 is a schematic cross-sectional view of a semiconductor structure according to an embodiment of the present invention.
Figure 2:
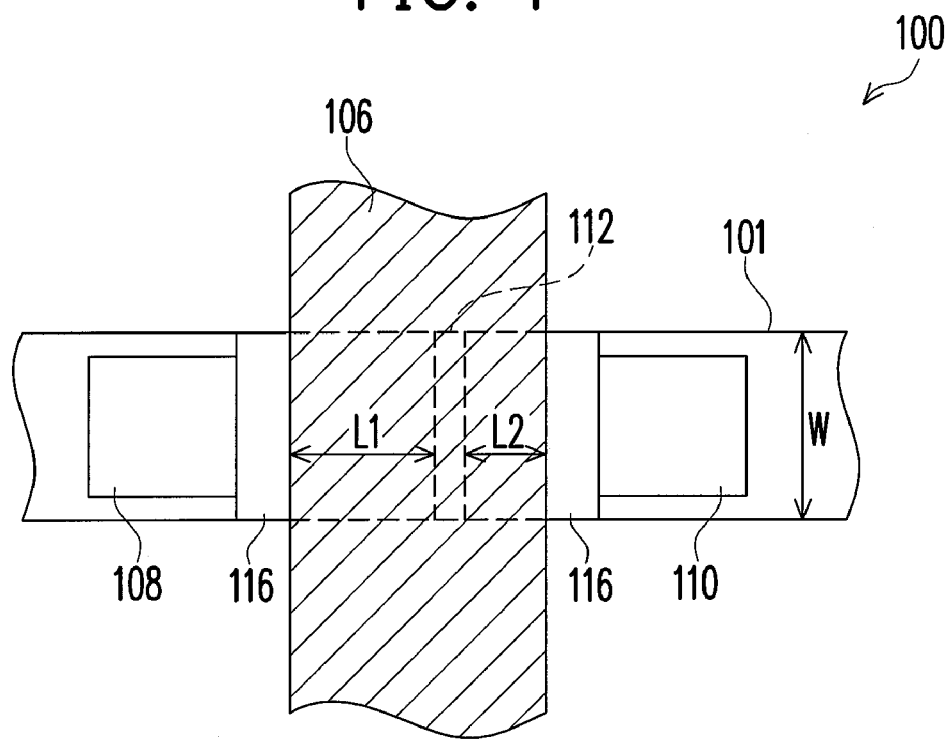
FIG. 2 is a local top view of the semiconductor structure in FIG. 1.

FIG. 1 is a schematic cross-sectional view of a semiconductor structure according to an embodiment of the present invention. FIG. 2 is a local top view of the semiconductor structure in FIG. 1.

Referring to FIGS. 1 and 2, a semiconductor structure 100 includes a substrate 102, a gate dielectric layer 104, a gate 106, a source region 108 and a drain region 110. The substrate 102 may be an N-type substrate or a P-type substrate, or a substrate having a well (not shown) therein with a different conductivity type from the substrate. The material of the substrate 102 includes silicon, such as monocrystalline silicon, epitaxial silicon, polysilicon, silicon germanium (SiGe) or silicon carbide (SiC), etc. The substrate 102 has an active area 101. The gate dielectric layer 104 is disposed on the substrate 102 in the active area 101. The gate dielectric layer 104 includes silicon oxide, for example. Further, at least one recess 112 is disposed in the substrate 102.

The gate 106 is disposed on the gate dielectric layer 104 and in the recess 112. The gate 106 includes polysilicon, polycide, silicide or metal, for example. In an embodiment, spacers 116 can be optionally disposed on the sidewalls of the gate 106. The source region 108 and the drain region 110 are respectively disposed in the substrate 102 beside the gate 106. The source region 108 includes a lightly doped region 107 and a heavily doped region 111. The drain region 110 includes a lightly doped region 109 and a heavily doped region 113. The source region 108 and the grain region 110 are N-type doped regions or P-type doped regions, for example.

Under an operation condition where the voltage applied to the gate 106 is higher than the voltages applied to the substrate 102, the source region 108 and the drain region 110, an electron-rich inversion layer 114 is formed between the gate dielectric layer 104 and the substrate 102, so that the gate current $I_G$ is divided into a source current $I_S$ flowing toward the source region 108 and a drain current $I_D$ flowing toward the drain region 110 along the inversion layer 114. The magnitudes of the source current and the drain current satisfy the following equations:

$$I_S \sim I_G \times L2/(L1+L2) \quad (1)$$

$$I_D \sim I_G \times L1/(L1+L2) \quad (2)$$

wherein L1 is the shortest distance between the recess 112 and the source region 108, and L2 is the shortest distance between the recess 112 and the source region 110 is L2. From the equations (1) and (2), the source current $I_S$ is proportional to L2/(L1+L2), and the drain current $I_D$ is proportional to L1/(L1+L2). Therefore, the semiconductor structure 100 in which the recess 112 is disposed in the substrate 102 divides the current under an appropriate condition, so that the purpose of dividing the gate current $I_G$ into the source current $I_S$ and the drain current $I_D$ is achieved. In other words, the semiconductor structure of the present invention serves as a current divider, and the inversion layer 114 serves as a resistor. The magnitudes of the source current $I_S$ and the drain current $I_D$ can be changed by adjusting the width and position of the recess 112 as well as the voltages applied to the gate 106, the substrate 102, the source region 108 and the drain region 110.

It is noted that, in the present invention, the semiconductor structure serving as a current divider has the same structure as a conventional MOS structure, so that the forming method thereof can be integrated with the current processes. Therefore, the process complexity is reduced and the fabrication cost is lower. Further, in the present invention, the purpose of dividing current is achieved by only disposing at last one recess in the substrate, and the layout for the large-dimension polysilicon layer and metal layer formed in a snake shape is not required, so that the dimension of the semiconductor structure serving as a current divider is reduced, and the level of integration and the performance of the device are enhanced.

Figure 3:
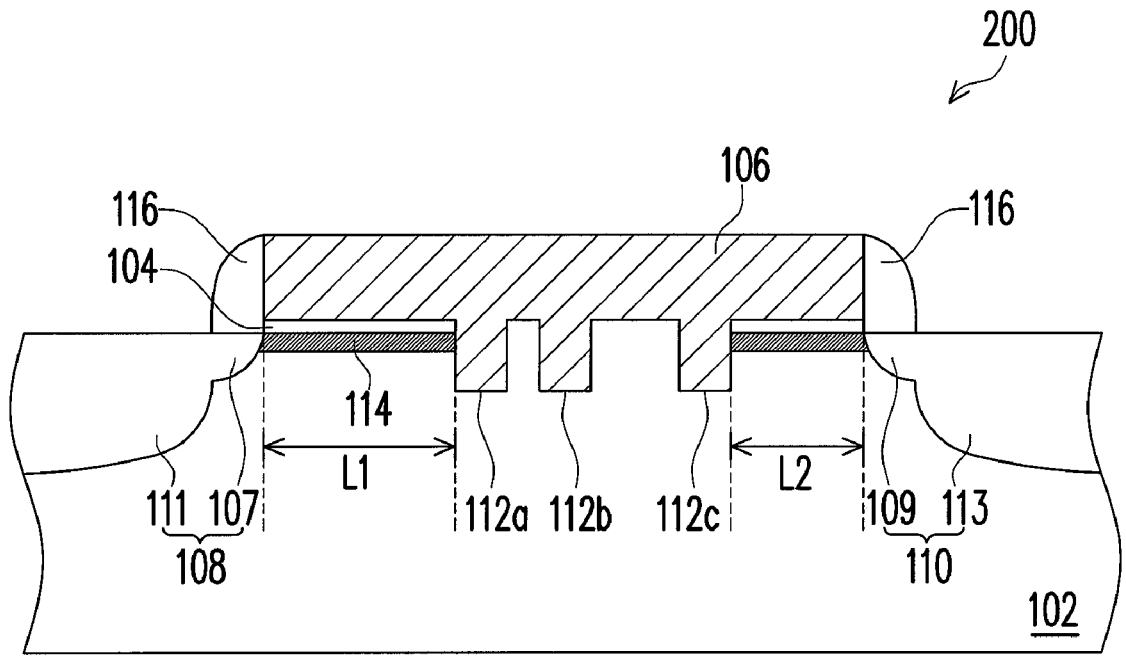
FIG. 3 is a schematic cross-sectional view of a semiconductor structure according to another embodiment of the present invention.
Figure 4:
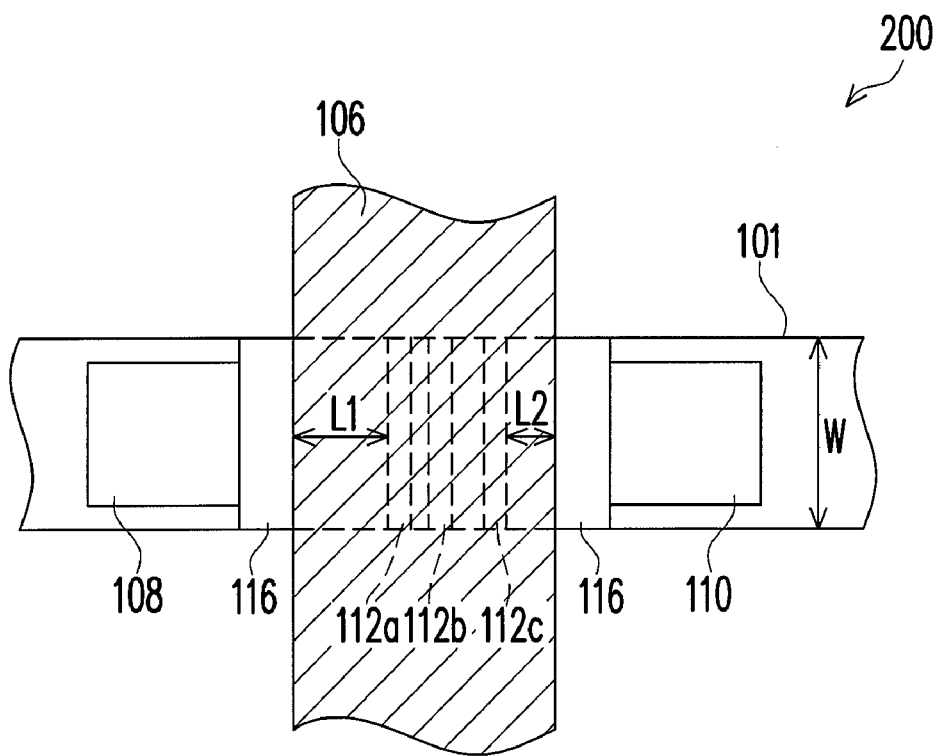
FIG. 4 is a local top view of the semiconductor structure in FIG. 3.

The above-mentioned embodiment in which a recess 112 is disposed in the substrate 102 is provided for illustration purposes, and is not to be construed as limiting the present invention. That is, the number of recesses is not limited by the present invention. For example, as shown in FIGS. 3 and 4, a plurality of recesses 112a, 112b and 112c is disposed in the substrate 102. The shortest distance between the source region 108 and each of the recesses 112a, 112b and 112c is L1, i.e. the distance between the source region 108 and the recess 112a. The shortest distance between the drain region 110 and each of the recesses 112a, 112b and 112c is L2, i.e. the distance between the source region 110 and the recess 112c. The equations (1) and (2) are also applicable to the semiconductor structure 200 in FIGS. 3 and 4. The magnitudes of the source current $I_S$ and the drain current $I_D$ can be changed by adjusting the widths and positions of the recesses 112a, 112b and 112c as well as the voltages applied to the gate 106, the substrate 102, the source region 108 and the drain region 110.

Figure 5:
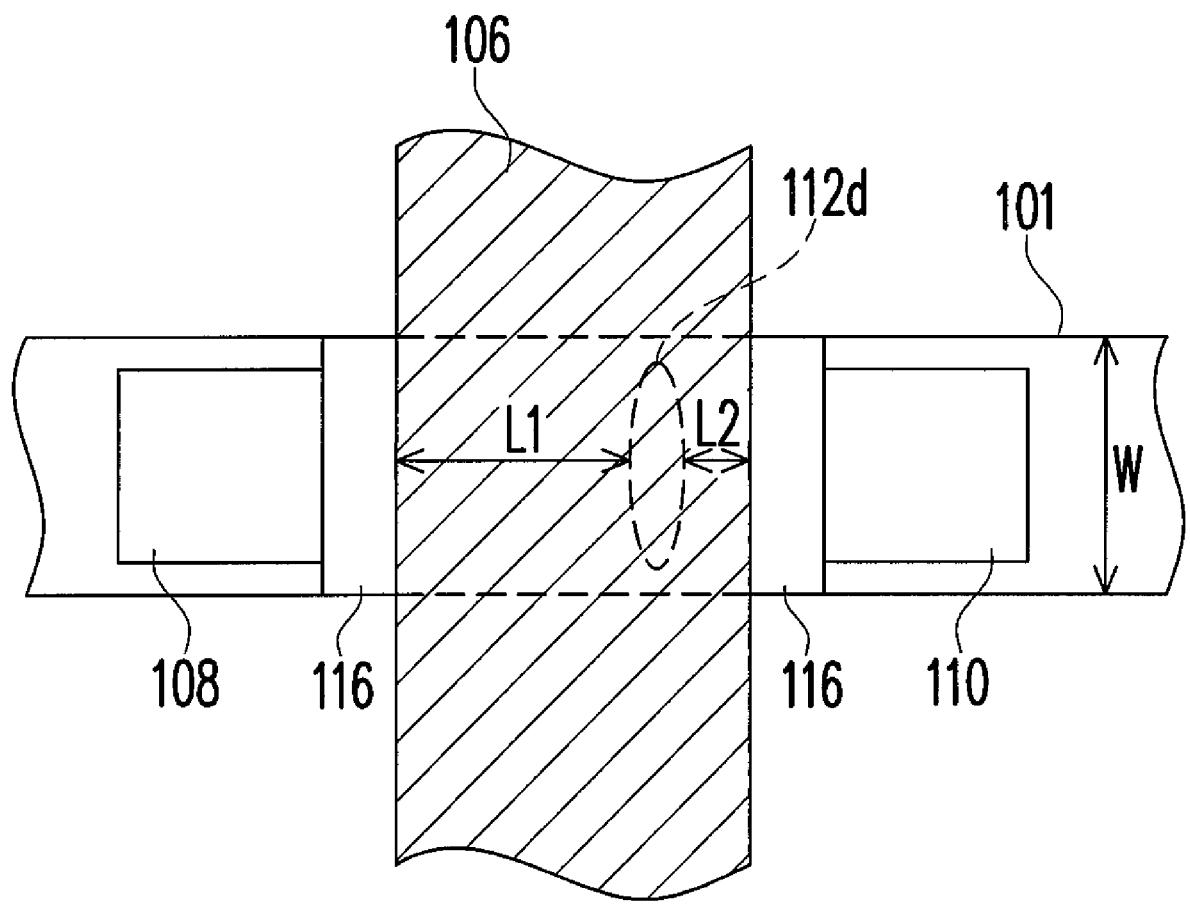
FIG. 5 is a schematic cross-sectional view of a semiconductor structure according to still another embodiment of the present invention.

Further, the recesses are shaped as stripes in FIGS. 1 to 4, and the widths thereof are the same as the width W of the active area 101. However, the present invention is not limited thereto. In another embodiment, a recess can be formed as any shape, and the width of the recess can be smaller than the width of the active area 101, as referred to the elliptical recess 112d in FIG. 5, for example.

Moreover, in the above-mentioned embodiment, the electron-rich inversion layer 114 is formed between the gate dielectric layer 104 and the substrate 102 due to a higher voltage applied to the gate 106 than the substrate 102. However, the present invention is not limited thereto. In another embodiment, when the voltage applied to the substrate 102 is higher than that applied to the gate 106, a hole-rich accumulation layer (not shown) is formed between the gate dielectric layer 104 and the substrate 102. The accumulation layer serves as a resistor and the purpose of dividing the gate current $I_G$ into a source current $I_S$ and a drain current $I_D$ along the accumulation layer is achieved.

Several embodiments are enumerated hereinafter for elaborating methods of forming the semiconductor structure of the present invention.

First Embodiment

Figure 6A:
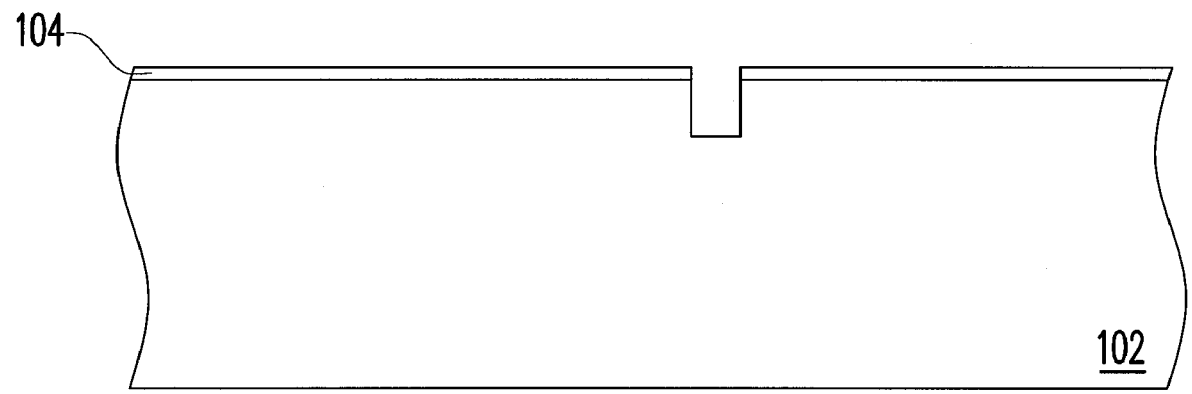
FIGS. 6A to 6B are schematic cross-sectional views illustrating a method of fabricating a semiconductor device according to the first embodiment of the present invention.
Figure 6B:
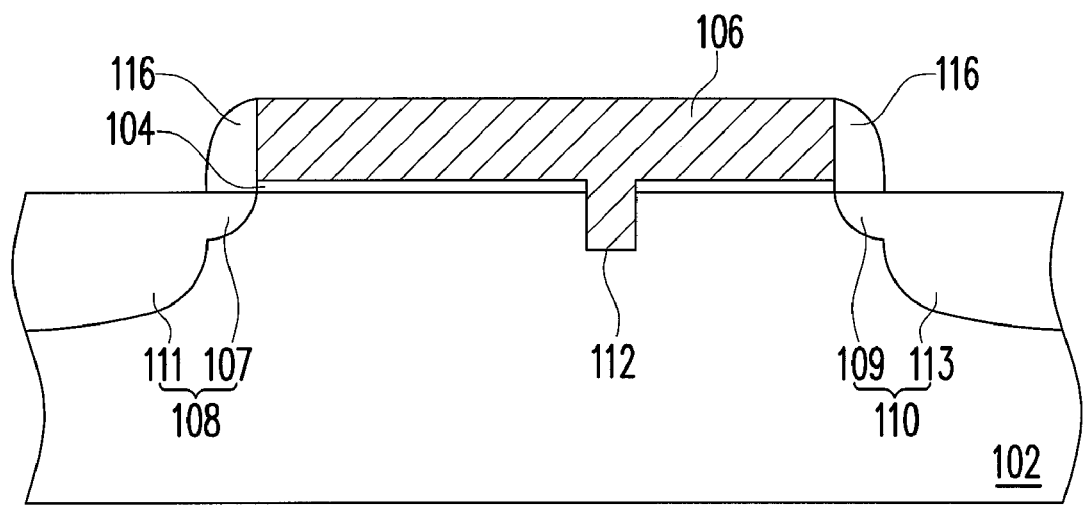

FIGS. 6A to 6B are schematic cross-sectional views illustrating a method of fabricating a semiconductor device according to the first embodiment of the present invention.

Referring to FIG. 6A, a gate dielectric layer 104 is formed on a substrate 102. The substrate 102 may be an N-type substrate or a P-type substrate, or a substrate having a well (not shown) therein with a different conductivity type from the substrate. The material of the substrate 102 includes silicon, such as monocrystalline silicon, epitaxial silicon, polysilicon, SiGe or SiC, etc. The gate dielectric layer 104 includes silicon oxide and the forming method thereof includes performing a thermal oxidation process or a chemical vapor deposition (CVD) process, for example. Thereafter, at least one recess 112 is formed in the substrate 102. The method of forming the recess 112 includes performing an etching process, for example. In addition, the step of forming the recess 112 and the step of forming shallow trench isolation (STI) structures can be performed simultaneously.

It is noted that the steps in FIG. 6 are exchangeable. For example, at least one recess 112 is formed in the substrate 102, and then a gate dielectric layer 104 is formed on the substrate 102, so that the dielectric layer 104 is formed simultaneously on the surface of the substrate 102 and the recess 112. Thereafter, an etching process is performed to remove the gate dielectric layer 104 on the surface of the recess 112.

Referring to FIG. 6B, a gate 106 is formed on the gate dielectric layer 104 and in the recess 112. The gate 106 includes polysilicon, polycide, silicide or metal, and the forming method thereof includes performing a CVD process, for example. Thereafter, an ion implantation process with N-type or P-type dopants is performed, using the gate 106 as a mask, so as to form lightly doped regions 107 and 109 in the substrate 102 beside the gate 106. Thereafter, spacers 116 are formed on the sidewalls of the gate 106. The spacers 116 include silicon oxide, for example. The method of forming the spacers 116 includes forming a spacer material layer (not shown) with CVD on the substrate 102, and then removing a portion of the spacer material layer by performing an anisotropic etching process. Afterwards, another ion implantation process with N-type or P-type dopants is performed, using the spacers 116 as a mask, so as to form heavily doped regions 111 and 113 in the substrate 102 beside the spacers 116. The lightly doped region 107 and the heavily doped region 111 form a source region 108. The lightly doped region 109 and the heavily doped region 113 form a drain region 110.

Second Embodiment

Figure 7A:
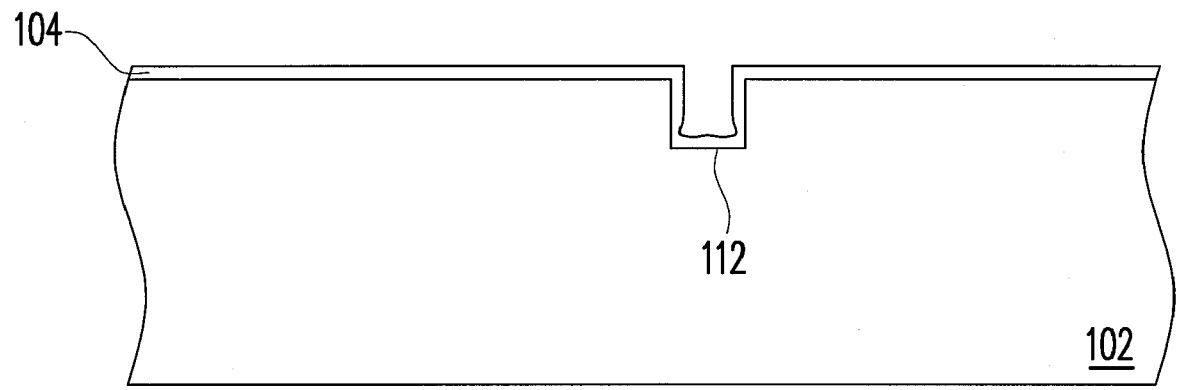
FIGS. 7A to 7C are schematic cross-sectional views illustrating a method of fabricating a semiconductor device according to the second embodiment of the present invention.
Figure 7B:
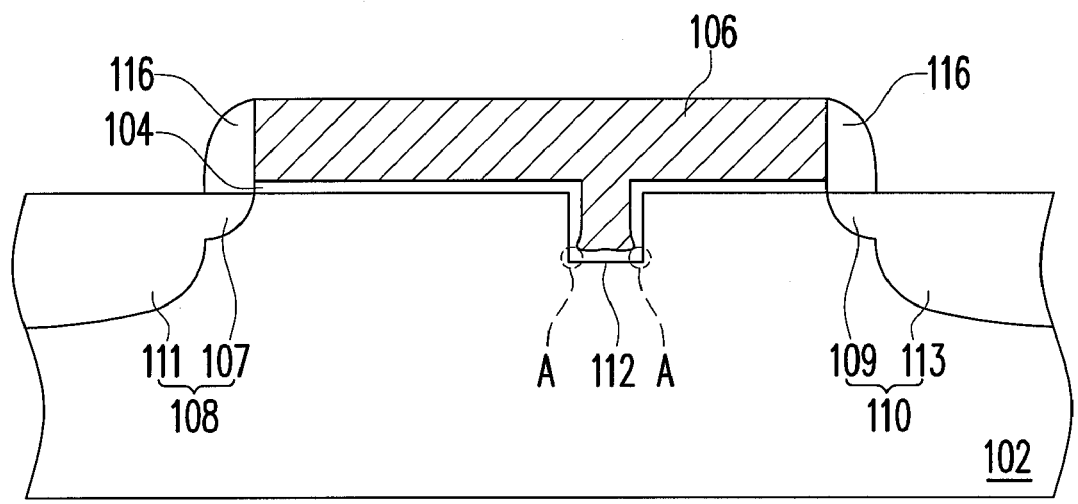
Figure 7C:
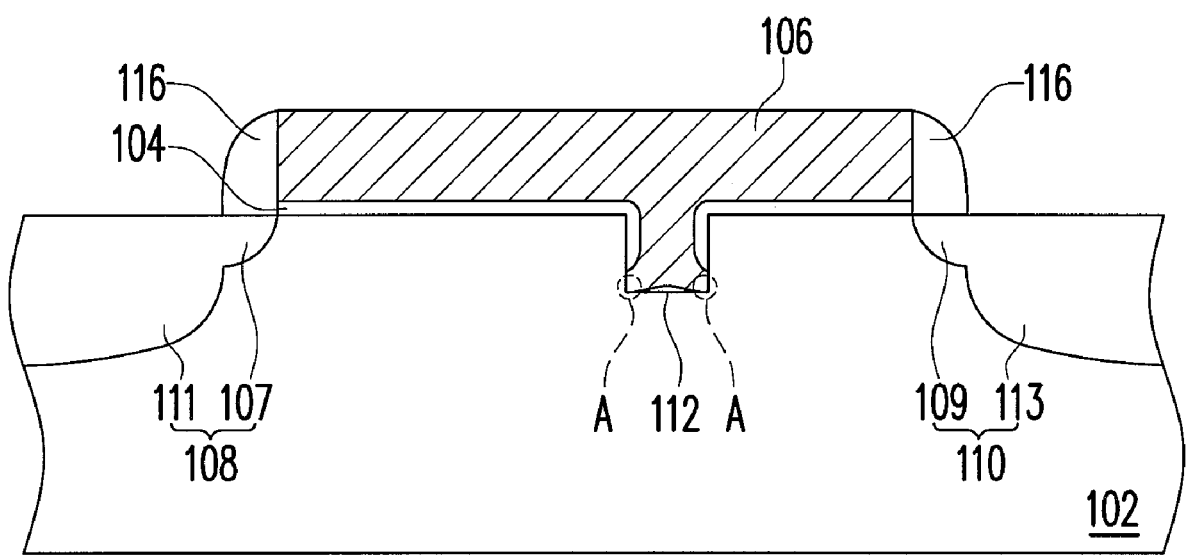

FIGS. 7A to 7C are schematic cross-sectional views illustrating a method of fabricating a semiconductor device according to the second embodiment of the present invention. The second embodiment is similar to the first embodiment, and only the difference is illustrated in the following.

Referring to FIG. 7A, at least one recess 112 is formed in a substrate 102. Thereafter, a gate dielectric layer 104 is formed on the substrate 102. The gate dielectric layer 104 is formed simultaneously on the surface of the substrate 102 and the recess 112.

Referring to FIG. 7B, a gate 106 is formed on the gate dielectric layer 104 and in the recess 112. Thereafter, an ion implantation process is performed, using the gate 106 as a mask, so as to form lightly doped regions 107 and 109 in the substrate 102 beside the gate 106. Afterwards, spacers 116 are formed on the sidewalls of the gate 106. Another ion implantation process is then performed, using the spacers 116 as a mask, so as to form heavily doped regions 111 and 113 in the substrate 102 beside the spacers 116. The lightly doped region 107 and the heavily doped region 111 form a source region 108. The lightly doped region 109 and the heavily doped region 113 form a drain region 110.

Referring to FIG. 7C, the gate dielectric layer 104 disposed around the bottom corners (points A) of the recess 112 is burned by point discharge, so that the gate 106 in the recess 112 is connected to the inversion layer or the accumulation layer (not shown) formed therebeside, and the purpose of dividing current is achieved.

It is noted that the structure in FIG. 7B not only serves as a current divider after the gate dielectric layer 104 around the bottom corners in the recess 112 is burned, but also serves as a one time programming MOS structure for repairing codes of the device. For example, in FIG. 7B, the code is 0 when the gate 106 is disconnected to the inversion layer or the accumulation layer formed therebeside. When a code repair is required, the gate dielectric layer 104 around the bottom corners in the recess 112 is burned by point discharge (as shown in FIG. 7C), so that the code is changed to 1 when the gate 106 is connected to the inversion layer or the accumulation layer formed therebeside.

Further, the magnitude of electric field is greater at points of greater curvature (i.e. points A) on the surface, so that the areas (i.e. points A) burned by point discharge are predicable. Therefore, when the structure in FIG. 7B serves as a one time programming MOS structure, unpredictable burned points do not occur and the reliability thereof is significantly enhanced.

In summary, in the present invention, the semiconductor structure in which at least one recess is disposed in the substrate and a dielectric layer is not disposed on the surface of the recess can serve as a current divider, and the purpose of diving the gate current into a source current and a drain current is achieved. The semiconductor structure serving as a current divider has the same structure as a conventional MOS structure, so that the forming method thereof can be integrated with the current processes, and hence, the process complexity is reduced and the fabrication cost is lower. Further, the semiconductor structure serving as a current divider does not require the large-dimension polysilicon layer and metal layer formed in a snake shape, so that the dimension thereof is reduced, and the level of integration and the performance of the device are significantly enhanced.

Further, in the present invention, the semiconductor structure in which at least one recess is disposed in the substrate and a dielectric layer is disposed on the surface of the recess can serve as a one time programming MOS structure for repairing codes of the device. The one time programming MOS structure of the present invention does not have unpredictable burned points, so that the reliability thereof is greatly enhanced. In addition, the above-mentioned semiconductor structure can serve as a current divider after the gate dielectric layer around the bottom corners in the recess is burned, and the advantages of small area and easy integration with the current processes are mentioned as above.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A semiconductor structure, comprising:
   a gate dielectric layer, disposed on a substrate, wherein at least one recess is disposed in the substrate;
   a gate, disposed on the gate dielectric layer and in the substrate; and
   a source region and a drain region, respectively disposed in the substrate beside the gate, wherein under an operation condition, an inversion layer or an accumulation layer is formed between the gate dielectric layer and the substrate, so that a gate current is divided into a source current flowing toward the source region and a drain current flowing toward the drain region along the inversion layer or the accumulation layer.

2. The structure of claim 1, wherein when the shortest distance between the at least one recess and the source region is L1 and the shortest distance between the at least one recess and the drain region is L2, the source current is proportional to L2/(L1+L2) and the drain current is proportional L1/(L1+L2).

3. The structure of claim 1, further comprising a dielectric layer disposed on a surface of the recess.

4. The structure of claim 1, wherein a dielectric layer is not disposed on a surface of the recess.

5. The structure of claim 1, further comprising a well disposed in the substrate.

6. The structure of claim 1, wherein the substrate comprises silicon.

7. The structure of claim 1, wherein the gate dielectric layer comprises silicon oxide.

8. The structure of claim 1, wherein the gate comprises polysilicon, polycide, silicide or metal.

9. A method of fabricating a semiconductor structure, comprising:
   forming a gate dielectric layer on the substrate;
   forming at least one recess in the substrate;
   forming a gate on the gate dielectric layer and in the recess; and
   forming a source region and a drain region in the substrate beside the gate,
   wherein under an operation condition, an inversion layer or an accumulation layer is formed between the gate dielectric layer and the substrate, so that a gate current is divided into a source current flowing toward the source region and a drain current flowing toward the drain region along the inversion layer or the accumulation layer.

10. The method of claim 9, wherein when the shortest distance between the at least one recess and the source region is L1 and the shortest distance between the at least one recess and the drain region is L2, the source current is proportional to L2/(L1+L2) and the drain current is proportional L1/(L1+L2).

11. The method of claim 9, wherein the step of forming the gate dielectric layer is before the step of forming the at least one recess.

12. The method of claim 9, wherein the step of forming the gate dielectric layer is after the step of forming the at least one recess.

13. The method of claim 9, wherein the step of forming the gate dielectric layer comprises performing an oxidation process or a CVD process.

14. The method of claim 9, wherein the step of forming the at least one recess comprises performing an etching process.

15. The method of claim 9, wherein the substrate comprises silicon.

16. The method of claim 9, wherein the gate dielectric layer comprises silicon oxide.

17. The method of claim 9, wherein the gate comprises polysilicon, polycide, silicide or metal.

* * * * *